US009473813B2

(12) United States Patent
Gupta et al.

(10) Patent No.: US 9,473,813 B2
(45) Date of Patent: Oct. 18, 2016

(54) SYSTEM AND METHOD FOR PROVIDING IMMERSIVE SURROUND ENVIRONMENT FOR ENHANCED CONTENT EXPERIENCE

(75) Inventors: Puneet Gupta, Karnataka (IN); Akshay Darbari, Karnataka (IN)

(73) Assignee: Infosys Limited, Bangalore, Karnataka (IN)

(*) Notice: Subject to any disclaimer, the term of this patent is extended or adjusted under 35 U.S.C. 154(b) by 1407 days.

(21) Appl. No.: 12/717,168

(22) Filed: Mar. 4, 2010

(65) Prior Publication Data

US 2011/0160882 A1    Jun. 30, 2011

(30) Foreign Application Priority Data

Dec. 31, 2009  (IN) ............................ 3251/CHE/2009

(51) Int. Cl.
| | | |
|---|---|---|
| G06F 17/00 | (2006.01) | |
| H03G 3/20 | (2006.01) | |
| H04R 5/00 | (2006.01) | |
| H04N 21/44 | (2011.01) | |
| H04N 21/41 | (2011.01) | |
| H04N 21/431 | (2011.01) | |
| H04N 21/436 | (2011.01) | |
| H04N 21/439 | (2011.01) | |
| G06F 17/30 | (2006.01) | |
| H03G 3/32 | (2006.01) | |

(52) U.S. Cl.
CPC .... *H04N 21/44008* (2013.01); *H04N 21/4131* (2013.01); *H04N 21/431* (2013.01); *H04N 21/436* (2013.01); *H04N 21/4394* (2013.01); *G06F 17/3074* (2013.01); *G06F 17/30743* (2013.01); *H03G 3/32* (2013.01)

(58) Field of Classification Search
CPC ............. A63J 2001/00; A63J 2005/00; A63J 2005/001; A63J 2005/005; A63J 2005/006; A63J 2005/007; A63J 2005/008; A63J 2005/02; A63J 2005/025; G06F 17/00; G06F 17/3074; G06F 17/30743; H04S 3/00; H04S 3/02; H04S 7/00; H04S 7/305; H03G 3/32; H03G 3/24; H03G 9/00; H03G 9/005
USPC ............ 700/94; 375/240.01; 472/65, 74, 64; 381/22, 23, 57, 307
See application file for complete search history.

(56) References Cited

U.S. PATENT DOCUMENTS

| | | | | |
|---|---|---|---|---|
| 5,734,590 A | * | 3/1998 | Tebbe | .............................. 700/94 |
| 6,152,829 A | * | 11/2000 | Jaidka | .............................. 472/65 |
| 6,239,857 B1 | * | 5/2001 | Wittek | ............................. 352/85 |
| 6,338,818 B2 | | 1/2002 | Budman | |
| 6,409,599 B1 | * | 6/2002 | Sprout et al. | .................... 463/31 |

(Continued)

FOREIGN PATENT DOCUMENTS

JP         2004112658 A    *    4/2004    ............... H04N 5/91

*Primary Examiner* — Xu Mei
(74) *Attorney, Agent, or Firm* — Michael Best & Friedrich LLP

(57) ABSTRACT

A method and system for providing an immersive surround environment for enhanced content experience is provided. The method includes receiving an encoded media stream and processing the stream to obtain decoded media data. The received media stream can also be captured real-time media. The method further includes extracting one or more environmental parameters from the stream. The environmental parameters are then embedded or encoded. Thereafter, the method includes providing the one or more environmental parameters to one or more devices that control environmental conditions to produce environmental effects.

13 Claims, 15 Drawing Sheets

(56) References Cited

U.S. PATENT DOCUMENTS

| | | |
|---|---|---|
| 7,177,432 B2 * | 2/2007 | Eid et al. ............... 381/22 |
| 7,180,529 B2 | 2/2007 | Covannon et al. |
| 7,616,262 B2 | 11/2009 | Eves et al. |
| 2002/0039173 A1 * | 4/2002 | Wittek .................. 352/85 |
| 2003/0039365 A1 * | 2/2003 | Eid et al. .............. 381/27 |
| 2004/0015983 A1 * | 1/2004 | Lemmons ................ 725/12 |
| 2004/0167767 A1 * | 8/2004 | Xiong et al. ............ 704/1 |
| 2004/0218894 A1 * | 11/2004 | Harville et al. ......... 386/46 |
| 2006/0078288 A1 * | 4/2006 | Huang et al. ........... 386/52 |
| 2006/0149781 A1 * | 7/2006 | Blankinship ........... 707/103 R |
| 2006/0276174 A1 * | 12/2006 | Katz et al. ............. 455/410 |
| 2007/0074123 A1 * | 3/2007 | Omura et al. ........... 715/753 |
| 2007/0126927 A1 * | 6/2007 | Yun et al. .............. 348/473 |
| 2008/0167868 A1 * | 7/2008 | Kanevsky et al. ....... 704/233 |
| 2009/0209211 A1 * | 8/2009 | Kondo ................... 455/73 |
| 2009/0310865 A1 * | 12/2009 | Tarng et al. ........... 382/190 |
| 2010/0017003 A1 * | 1/2010 | Oh et al. ............... 700/94 |
| 2010/0257187 A1 * | 10/2010 | Fontijn et al. ......... 707/756 |
| 2011/0242288 A1 * | 10/2011 | Francisco .............. 348/51 |

* cited by examiner

SYSTEM AND METHOD FOR PROVIDING IMMERSIVE SURROUND ENVIRONMENT FOR ENHANCED CONTENT EXPERIENCE

FIELD OF THE INVENTION

The present invention relates generally to media content experience and more specifically to a system and method for providing an immersive surround environment for enhanced content experience.

BACKGROUND OF THE INVENTION

Rendering of media (image/audio/speech/video/audio-video) content on any system including television, cinema halls, personal computer is generally based on a single media stream. A viewer has limited options as far as content is concerned. The role of the viewer in conventional content rendering devices is quite passive. The user can only increase or decrease the volume, change the brightness or contrast level of the rendering device and can record or playback content among other features that are available on content rendering devices. However, if a user wants to immerse himself in the scene he has to watch the content with great interest and involvement which is not possible in all situations.

To overcome the abovementioned disadvantages, contents have been encoded with surround sound and vision parameters wherein the user is able to feel the sense of direction and is able to feel realism because of sound, lighting effects and three dimensional displays. However, experience of feeling the situation or content is still not achieved by the abovementioned solutions.

In light of the abovementioned disadvantages, there is a need for a system and method for providing an immersive enhanced content experience to the users. Further, there is a need to employ environmental parameters in synchronization with the media stream. In addition, there is a need to insert environmental parameters in the stream during encoding for better depiction of content and to generate real effects while rendering. Furthermore, there is a need to encode environmental parameters separately with frame sync and/or other stream elements synchronization information and play it back along with media stream with the help of a device or play it along with media content.

SUMMARY OF THE INVENTION

A system and method for providing immersive surround environment for enhanced content experience is provided.

In an embodiment of the present invention, the system of the invention comprises a decoder configured to receive an encoded media stream and further configured to decompress and decode the media stream. The system further comprises a content analyzer configured to extract environmental information from the decoded media stream and an environmental effect encoder configured to encode environmental parameters along with frame synchronization and stream elements information. The system also comprises an encoded stream playback system configured to decode the encoded stream and the encoded environmental parameters.

In an embodiment of the present invention, the system of the invention comprises a real time media capture module configured to capture real time media data and a real time environmental parameter capture module configured to capture environmental parameters associated with the media data. Further, the system comprises a stream and environmental parameter synchronization module configured to synchronize the encoded stream with the environmental parameters in order to output an embedded stream and a specialized encoder configured to determine the use of environmental parameters for particular frames of media data. The system also comprises an environmental parameter based decoder configured to decode the embedded stream, an audio video and environmental parameter splitter configured to split the media output from environmental effects output and a centralized system configured to receive environmental effects output from the media and environmental parameter splitter.

In an embodiment of the present invention, the system of the invention comprises a real time media capture module configured to capture real time media data, a media encoder configured to encode the real time media data, a real time environmental parameter capture module configured to capture environmental parameters associated with the media data and a frame information extractor module configured to extract information corresponding to one or more frames of the captured real time media. Further, the system of the invention comprises an environmental effect encoder configured to encode environmental parameters along with frame synchronization and stream elements information and a system for normal encoded stream playback configured to produce media output and further configured to provide environmental effects to one or more output devices.

A method for providing an immersive surround environment for enhanced content experience is provided. The method comprises, firstly, receiving an encoded media stream and processing the encoded media stream to obtain decoded media data. Secondly, the method comprises extracting one or more environmental parameters corresponding to the encoded media stream from the decoded media data. The method further comprises encoding the one or more environmental parameters, frame synchronization and one or more stream element information corresponding to the encoded media stream to output an encoded environmental parameter stream. Further, the method comprises decoding the encoded media stream to obtain media output. Furthermore, the method comprises decoding the encoded environmental parameter stream to obtain one or more environmental parameters. Finally, the method comprises providing the one or more environmental parameters to one or more devices that control environmental conditions to produce the environmental effects.

In an embodiment of the present invention, the method further comprises manually extracting one or more environmental parameters. In another embodiment of the present invention, the method further comprises artificially simulating one or more environmental parameters.

In an embodiment of the present invention, encoding one or more environmental parameters comprises encoding the one or more environmental parameters at various levels within the encoded media stream. In an embodiment of the present invention, the various levels comprise at least one of: stream, group of pictures, frame, slice, macroblock and block.

In an embodiment of the present invention, encoding the one or more environmental parameters to output an encoded environmental parameter stream comprises, firstly, replicating encoded media stream structure by retaining header information of the encoded media stream. Secondly, the method comprises mapping the one or more environmental parameters to one or more specific identifiers of the encoded media stream.

In an embodiment of the present invention, a method of encoding and decoding one or more environmental parameters is provided, the method comprises, firstly, receiving an environmental parameter stream comprising the one or more environmental parameters. Secondly, the method comprises replicating an encoded media stream by retaining header information of the encoded media stream. Further, the method comprises incorporating placeholders corresponding to at least one of image streams, audio/speech streams, audio streams and audio-video file formats. The method further comprises mapping the one or more environmental parameters to one or more specific identifiers of the replicated encoded media stream. Finally, the method comprises decoding the encoded environmental parameter stream to obtain one or more environmental parameters.

In another embodiment of the present invention, a method for providing an immersive surround environment for enhanced content experience is provided. The method comprises, firstly, capturing media data in real time. Secondly, the method comprises capturing environmental parameters associated with the media data in real time. Further, the method comprises embedding one or more environmental parameters at one or more levels of the media data. Furthermore, the method comprises encoding the embedded media data to output an encoded stream. Encoding the embedded media data further comprises selectively incorporating environmental parameters in the media data. The method further comprises decoding the encoded stream to obtain the media data and the one or more environmental parameters. Finally, the method comprises providing the one or more environmental parameters to one or more devices that control environmental conditions to produce environmental effects.

In an embodiment of the present invention, a method for providing an immersive surround environment for enhanced content experience. The method comprises, firstly, capturing media data in real time. Secondly, the method comprises extracting information corresponding to one or more frames of the captured media data to obtain frame synchronization and one or more stream element information. Further, the method comprises capturing one or more environmental parameters associated with the media data in real time. The method further comprises encoding the media data. Furthermore, the method comprises encoding the one or more environmental parameters, frame synchronization and one or more stream element information to obtain an encoded environmental parameter stream. The method further comprises decoding the encoded media data to obtain media data and decoding the encoded environmental parameter stream to obtain one or more environmental parameters. Finally, the method comprises providing the one or more environmental parameters to one or more devices that control environmental conditions to produce environmental effects.

BRIEF DESCRIPTION OF THE ACCOMPANYING DRAWINGS

The present invention is described by way of embodiments illustrated in the accompanying drawings wherein.

DETAILED DESCRIPTION OF THE INVENTION

The disclosure is provided in order to enable a person having ordinary skill in the art to practice the invention. Exemplary embodiments herein are provided only for illustrative purposes and various modifications will be readily apparent to persons skilled in the art. The general principles defined herein may be applied to other embodiments and applications without departing from the spirit and scope of the invention. The terminology and phraseology used herein is for the purpose of describing exemplary embodiments and should not be considered limiting. Thus, the present invention is to be accorded the widest scope encompassing numerous alternatives, modifications and equivalents consistent with the principles and features disclosed herein. For purpose of clarity, details relating to technical material that is known in the technical fields related to the invention have been briefly described or omitted so as not to unnecessarily obscure the present invention.

The present invention would now be discussed in context of embodiments as illustrated in the accompanying drawings.

Figure 1:
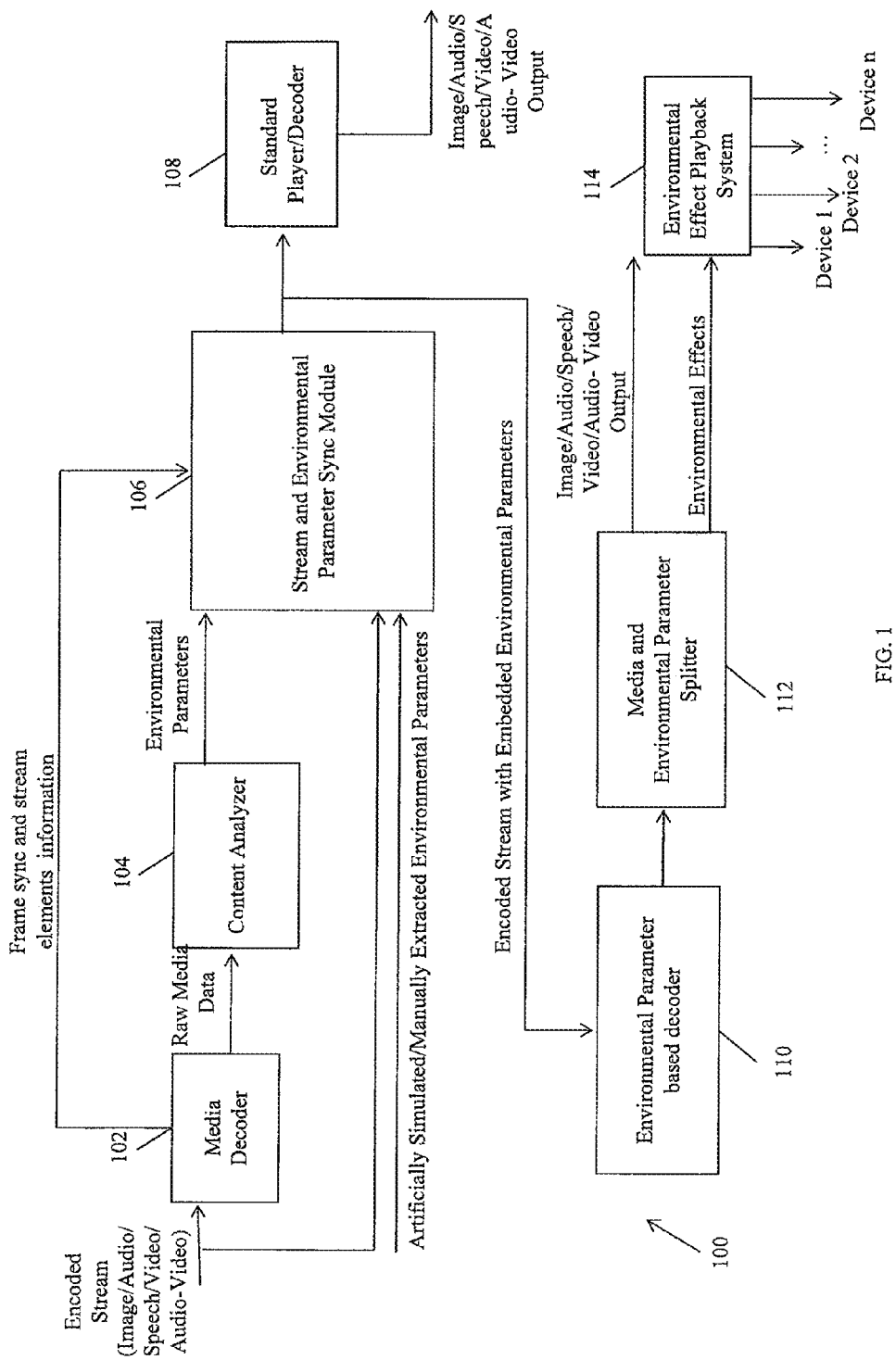
FIG. 1 illustrates a system for providing an immersive surround environment for enhanced content experience, in accordance with an embodiment of the present invention.

FIG. 1 illustrates a system 100 for providing an immersive surround environment for enhanced content experience, in accordance with an embodiment of the present invention. In various embodiments of the present invention, enhanced content experience includes viewing, listening, feeling, touching or any other sensory experience related to the rendered content. The system of the invention uses environmental parameters to extend existing concepts of 'surround' sound and vision to provide an immersive experience to users. The vicinity where audio-visual equipment is located may be considered as an extended environment of scene depicted in audio-visual content. The extended environment is used to provide environmental experience corresponding to environment depicted in scenes of audio-visual content. In an embodiment of the present invention, environmental parameters are encoded in a media stream and thereafter the media stream is decoded to extract the media data and environmental parameters. In various embodiments of the present invention, the media stream includes, but is not limited to, an image stream, an audio stream, a speech stream, a video stream and an audio-video stream. The environmental parameters are then used to activate systems that control environmental conditions in vicinity of the audio-visual equipment. As shown in the figure, the system 100 includes a media decoder 102, a content analyzer 104, a stream and environmental parameter sync module 106, a standard player/decoder 108, an environmental parameter based decoder 110, a media and environmental parameter splitter 112 and an environmental effect playback system 114. In an embodiment of the present invention, an encoded video stream is fed into the decoder 102. The encoded media stream may be an image stream such as JPEG, BMP, GIF, TIFF, PNG, JPEG2000, an audio/speech stream such as WAV, MPEG, G.711, G.723, AC3, AAC, WMA, a video stream compressed and encoded in accordance with standard video specifications such as MPEG-2, MPEG-4, AVS, VC-1, Dirac, H.264, an audio-video file format such as AVI, 3GP, WMV, DivX, MPEG-4, AVCHD etc. or even a raw uncompressed stream. In an embodiment of the present invention, the encoded stream may be a still image. The media decoder 102 decodes the media stream to extract raw media data. The content analyzer 104 extracts environmental parameters such as temperature, ambient light, humidity, wind velocity, thunders (such as ice, snow, fore, thunder, wind etc.) etc. from the raw video stream. In an embodiment of the present invention, the environmental parameters are extracted from various factors such as color layout, structure, shape, region, texture, location, face and motion of image/video stream. In another embodiment of the present invention the environmental parameters are extracted from various factors such as color layout, structure, shape, region, texture, location, face, motion from image and video stream, and/or pitch, harmony, tempo, rhythm, loudness, lyrics analyzer of audio/speech stream. In yet another embodiment of the present invention, the environmental parameters are extracted from various factors such as color layout, structure, shape, region, texture, location, face, motion from image and video stream, and pitch, harmony, tempo, rhythm, loudness, lyrics analyzer of audio-video stream.

The extracted environmental parameters are provided to the stream and environmental parameter sync module 106. Further, frame sync and stream elements information is provided by the media decoder 102 to the stream and environmental parameter sync module 106.

The stream and environmental parameter sync module 106 is similar to an audio video synchronizer used for synchronizing the encoded stream with the environmental parameters. In another embodiment of the present invention, instead of using extracted environmental parameters from media stream, environmental parameters are artificially simulated and/or manually extracted and are synchronized with encoded stream by the stream and environmental parameter sync module 106. Synchronization of environmental parameters with encoded stream includes processing of parameters in order to align them with the encoded stream and embed them along with the stream elements of the media stream at appropriate places in a non-intrusive manner such that these extra information can be skipped if the decode or player does not support it.

In an embodiment of the present invention, the encoded stream with embedded environmental parameters is provided to a standard player/decoder 108. The standard decoder 108 decodes the encoded stream, while ignoring environmental parameters. The standard decoder 108 then provides a media output independent of the environmental parameters.

In another embodiment of the present invention, the encoded stream with embedded environmental parameters is provided to the environmental parameter based decoder 110. The environmental parameter based decoder 110 is a specialized decoder configured to understand effect of environmental parameters on the encoded stream. The environmental parameter based decoder 110 decodes the stream including the effects of environmental parameters and outputs a signal to the media and environmental parameter splitter 112. The media and environmental parameter splitter 112 splits the media output from the environmental effects. The media output is provided to audio/visual equipment for rendering the stream. In an embodiment of the present invention, environmental effects from the media and environmental parameter splitter 112 is provided to the environmental effect playback system 114. Output from the environmental effects playback system 114 is presented to one or more output devices that control environmental conditions. (Device 1, Device 2 . . . Device n) In an embodiment of the present invention, the output device may be a centralized system adapted to control lighting condition, temperature, humidity, wind etc. in the vicinity of the location of the centralized system. For example, when the scene is that of a chilly full moon night, the centralized system uses the environmental effects output to adjust an air conditioner in order to simulate a cold environment. As a result, a viewer/listener experiences coldness in surrounding environment. Similarly, the centralized system may activate lighting system to simulate white light that may signify moonlight. In another example, if in a particular scene, the actor is walking through Sahara desert, the environmental effects are used to simulate heat so that the viewer feels scorching heat and humidity or the song is that of a rain, sprinklers can be turned on. The system 100 controls the environment so that the viewer is fully involved in the audio-visual scene, experiences what is going on and becomes part of content happening. In an embodiment of the present invention, the one or more output devices connected to the environmental effects output may not be configured to reproduce one or more environmental effects provided by the environmental effects playback system. In this case, devices configured to reproduce environmental effects are activated according to their respective environmental parameters and unusable environmental parameters are ignored.

Figure 2:
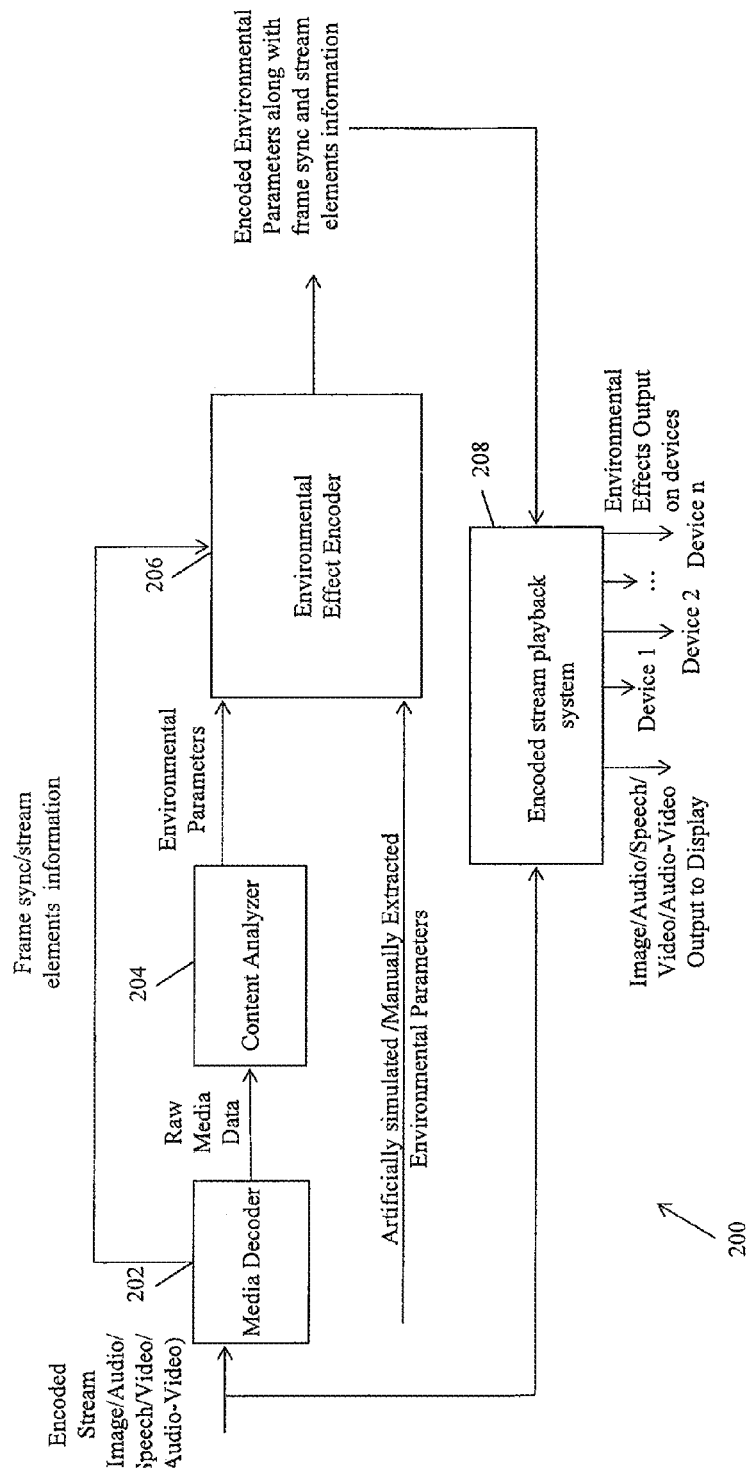
FIG. 2 illustrates a system for providing an immersive surround environment for enhanced content experience, in accordance with another embodiment of the present invention.

FIG. 2 illustrates a system 200 for providing an immersive surround environment for enhanced content experience, in accordance with another embodiment of the present invention.

As shown in the figure, the system 200 includes a media decoder 202, a content analyzer 204, an environmental effect encoder 206 and an encoded stream playback system 208. In an embodiment of the present invention, an encoded media stream is fed into the media decoder 202. In various embodiments of the present invention, the media stream includes, but is not limited to, an image stream, an audio stream, a speech stream, a video stream and an audio-video stream The encoded media stream may be an image stream such as JPEG, BMP, GIF, TIFF, PNG, JPEG2000, an audio/speech stream such as WAV, MPEG, G.711, G.723, AC3, AAC, WMA, a video stream compressed and encoded in accordance with standard video specifications such as MPEG-2, MPEG-4, AVS, VC-1, Dirac, H.264, a audio-video file format such as AVI, 3GP, WMV, DivX, MPEG-4, AVCHD and a raw uncompressed stream. The media decoder 202 decodes the encoded media stream to extract raw media data. The content analyzer 204 extracts environmental parameters such as temperature, ambient light, humidity, wind velocity, thunders (such as ice, snow, fore, thunder, wind etc.) etc. from the raw media stream. In an embodiment of the present invention, the environmental parameters are extracted from various factors such as color layout, structure, shape, region, texture, location, face and motion of image/video stream. In another embodiment of the present invention the environmental parameters are extracted from various factors such as color layout, structure, shape, region, texture, location, face, motion from image and video stream, and/or pitch, harmony, tempo, rhythm, loudness, lyrics analyzer of audio/speech stream. In yet another embodiment of the present invention, the environmental parameters are extracted from various factors such as color layout, structure, shape, region, texture, location, face, motion from image and video stream, and pitch, harmony, tempo, rhythm, loudness, lyrics analyzer of audio-video stream.

Environmental parameters extracted from the content analyzer 204 are then provided to the environmental effect encoder 206. The environmental effect encoder 206 then encodes the environmental parameters and synchronizes the encoded stream with the encoded environmental parameters. In another embodiment of the present invention, instead of using extracted environmental parameters from media stream, environmental parameters are artificially simulated and/or manually extracted and provided to the environmental effect encoder 206.

The input encoded stream along with encoded environmental parameters with frame synchronization and stream elements information is provided to the encoded stream playback system 208. In an embodiment of the present invention, the encoded stream playback system 208 comprises a standard player/decoder for decoding encoded stream to extract a media output that is provided to an audio/visual equipment for rendering the decoded stream. Further, the encoded stream playback system 208 is further configured to output environmental effects that are then presented to one or more devices to simulate the environmental effects in conjunction with the rendered decoded stream.

Figure 3:
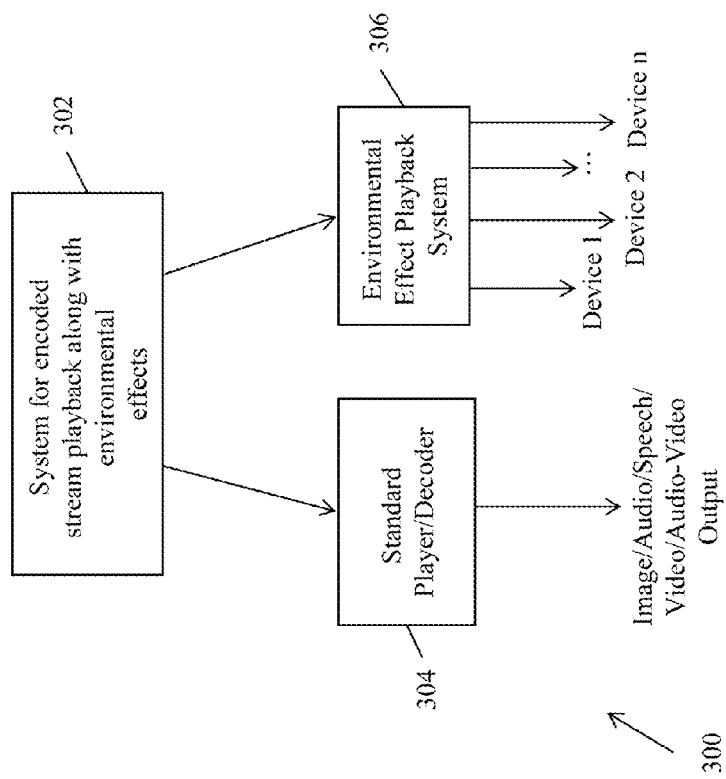
FIG. 3 illustrates sub-modules of an encoded stream playback system used in various embodiments of system of the present invention.

FIG. 3 illustrates sub-modules of an encoded stream playback system used in various embodiments of system of the present invention. As depicted in the figure, the encoded stream playback system 302 comprises a standard player/decoder 304 and an environmental effect playback system 306. In an exemplary embodiment of the present invention, the standard player/decoder 304 may comprise a de-multiplexer, a de-compresser and a dequantizer for decoding or playing back the encoded media stream.

The environmental effect playback system 306 comprises one or more actuating devices that are configured to actuate one or more environmental effect producing devices. The environmental effect producing devices include air conditioners, sensors, aroma producers, vibration devices and the like.

Figure 4:
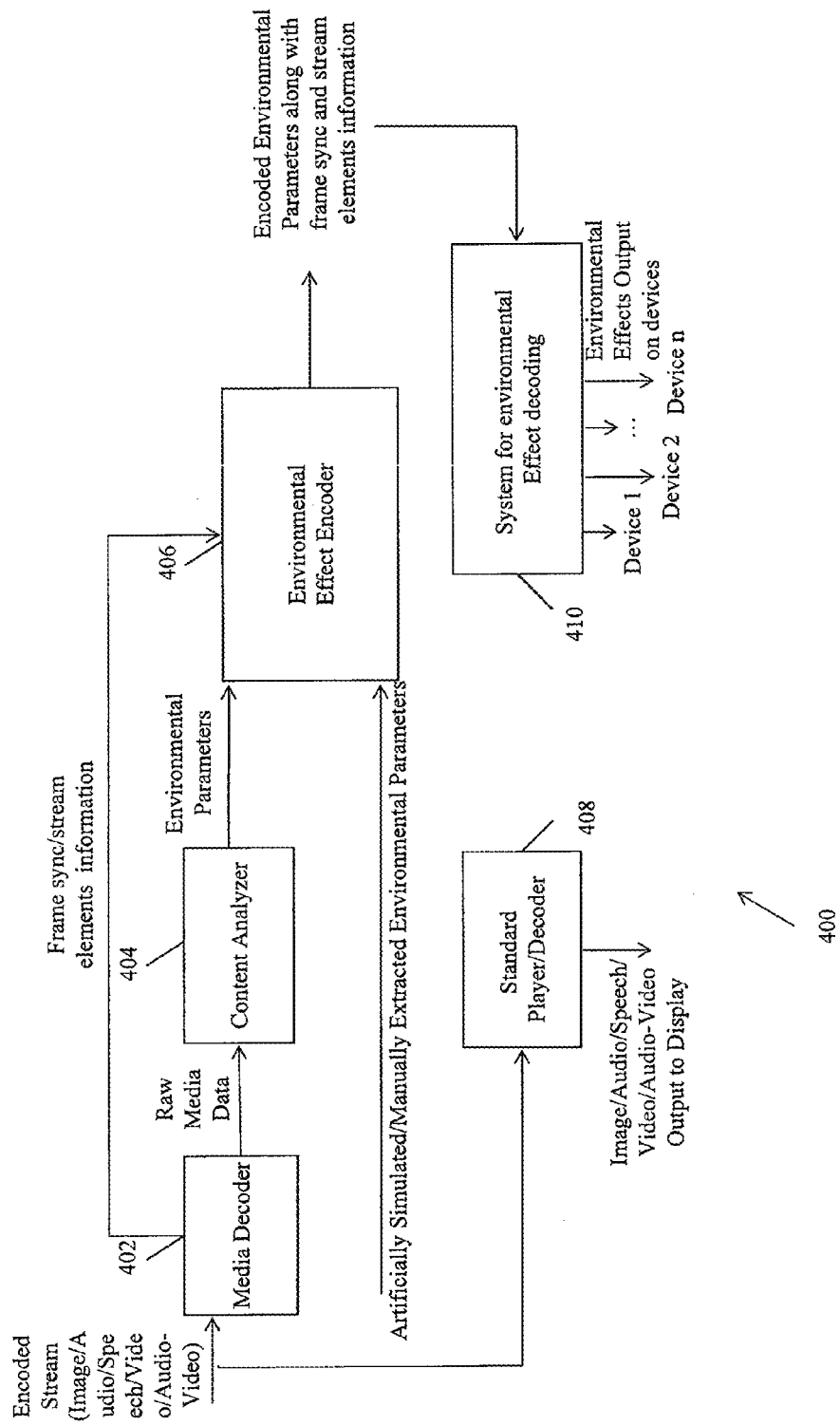
FIG. 4 illustrates a system for providing an immersive surround environment for enhanced content experience using separate modules for decoding media stream and environmental effects.

FIG. 4 illustrates a system 400 for providing an immersive surround environment for enhanced content experience using separate modules for decoding encoded stream and environmental effects. The system 400 comprises a media decoder 402, a content analyzer 404, an environmental effect encoder 406, a standard player/decoder 408 and a system for environmental effect decoding 410. As explained in the description of FIG. 2, the media decoder 402, the content analyzer 404, the environmental effect encoder 406 have functions similar to the media decoder 202, the content analyzer 204 and the environmental effect encoder 206 of the embodiment described in FIG. 2.

In an exemplary embodiment of the present invention, the standard player/decoder 408 takes as input the encoded stream and provides an media output to be displayed. In various embodiments of the present invention, the media stream includes, but is not limited to, an image stream, an audio stream, a speech stream, a video stream and an audio-video stream. The system for environmental effect decoding 410 is configured to decode the encoded environmental parameters in frame synchronization and stream elements information and provide the environmental effects output to one or more output devices for simulating environmental effects.

Figure 5:
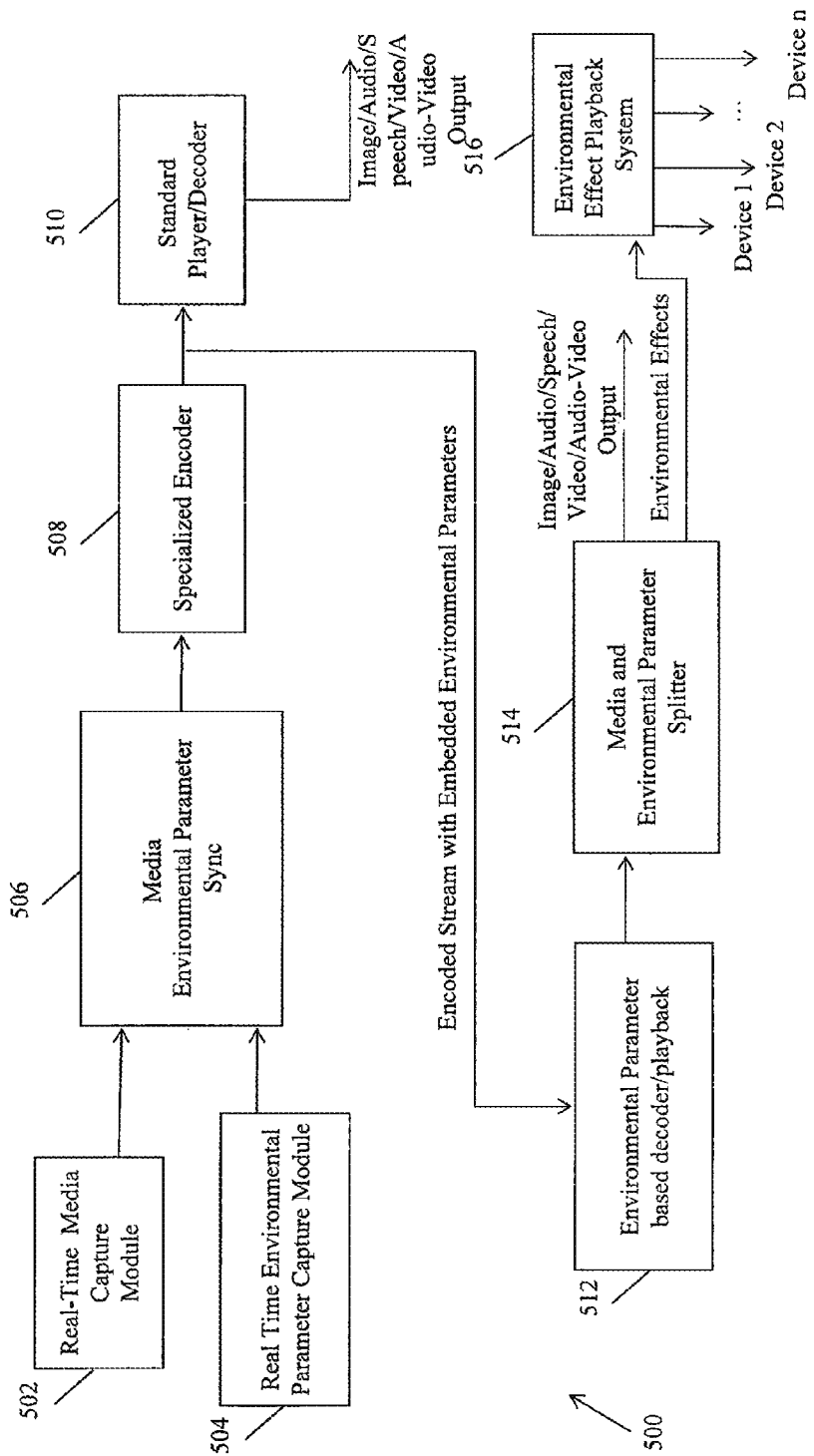
FIG. 5 illustrates a system for providing an immersive surround environment for enhanced content experience of media captured in real-time, in accordance with an embodiment of the present invention.

FIG. 5 illustrates a system 500 for providing an immersive surround environment for enhanced content experience in accordance with another embodiment of the present invention. In an embodiment of the present invention, the system 500 is configured to capture environmental conditions along with capturing of real-time media data. The system 500 includes a real-time media capture module 502, a real-time environmental parameter capture module 504, an media environmental parameter sync module 506, a specialized encoder 508, a standard player/decoder 510, an environmental parameter based decoder 512, an media environmental parameter splitter 514 and an environmental effect playback system 516. In various embodiments of the present invention, the real-time media capture module 502 may be a camcorder or a video camera that captures real time media. In various embodiments of the present invention, the captured media includes, but is not limited to, an image stream, an audio stream, a speech stream, a video stream and an audio-video stream. In another embodiment of the present invention, the real-time media capture module 502 may be a camera that captures still images. The real-time environmental parameter capture module 504 may capture real time environmental parameters such as temperature, wind velocity, humidity, light intensity, illumination details using various sensors. The stream and environmental parameter sync module 506 is similar to an audio/video synchronizer that is used for synchronizing the real-time media stream with the real-time environmental parameters. Output from the media and environmental parameter sync module 506 is provided to the specialized encoder 508. The specialized encoder 508 is configured to encode the media stream along with the environmental parameters. In an example, the specialized encoder 508 has the capability to ascertain which environmental parameters are to be considered and which are to be discarded.

In an embodiment of the present invention, the encoded stream with embedded environmental parameters is provided to a standard player/decoder 510. The standard decoder 510 decodes the encoded stream, while ignoring environmental parameters. The standard decoder 510 then provides a media output independent of the environmental parameters.

In another embodiment of the present invention, the encoded stream with embedded environmental parameters is provided to the environmental parameter based decoder 512. The environmental parameter based decoder 512 is a specialized decoder configured to understand effect of environmental parameters on the encoded stream. The environmental parameter based decoder 512 decodes the stream including the effects of environmental parameters and outputs a signal to the media and environmental parameter splitter 514. The media and environmental parameter splitter 514 splits the media output from the environmental effects. The media output is provided to an audio/visual equipment for rendering the stream. In an embodiment of the present invention, environmental effects from the media and environmental parameter splitter 112 is provided to the environmental effect playback system 114. Output from the environmental effects playback system 114 is presented to one or more output devices that control environmental conditions. (Device 1, Device 2 . . . Device n). In various embodiments of the present invention, the one or more devices that control environmental conditions may include, but are not limited to, air conditioning systems, sprinklers, blowers, actuators, sensors etc.

Figure 6:
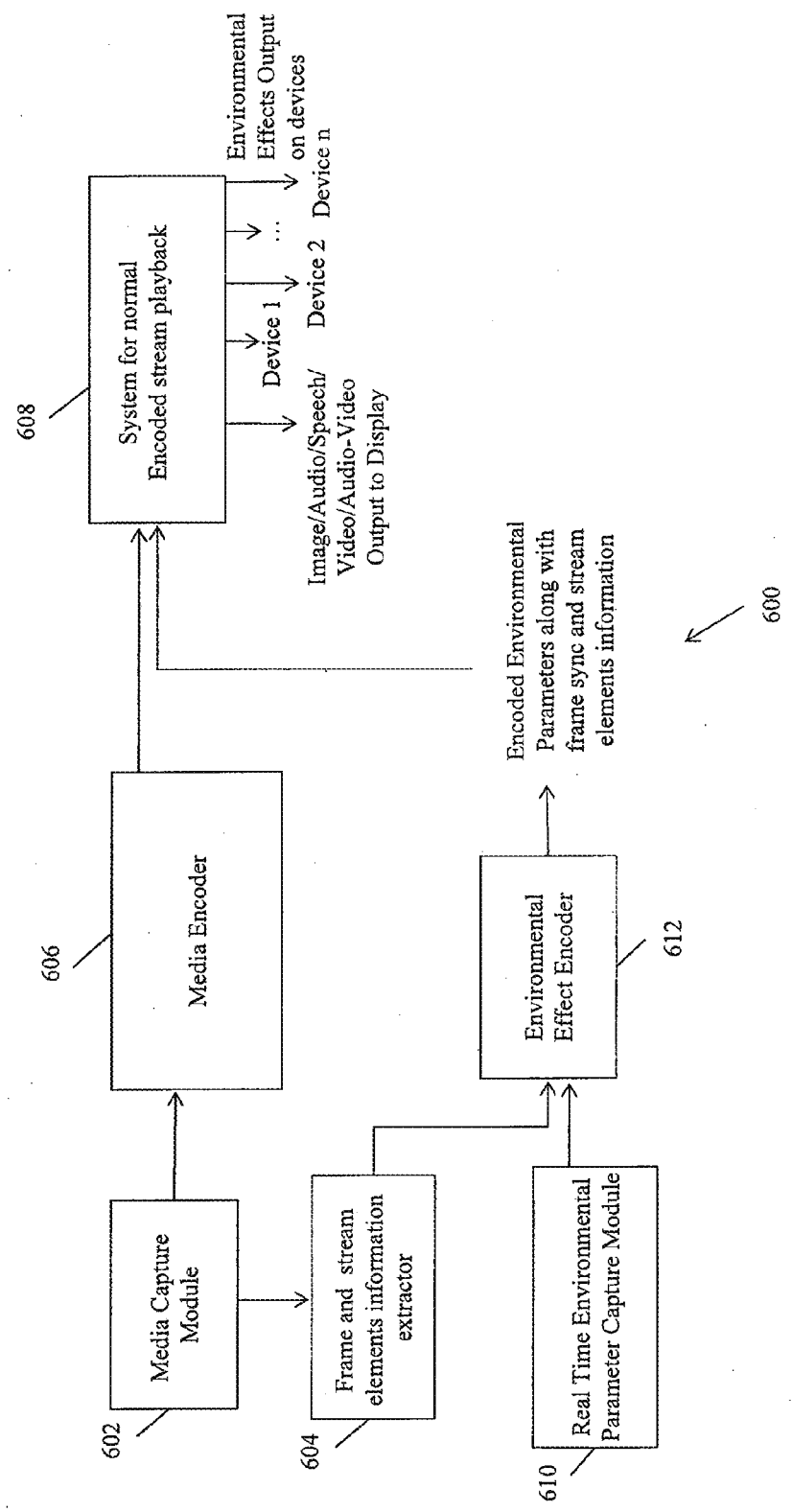
FIG. 6 illustrates a system for providing an immersive surround environment for enhanced content experience of media captured in real-time, in accordance with another embodiment of the present invention.

FIG. 6 illustrates a system 600 for providing an immersive surround environment for enhanced content experience of media captured in real-time, in accordance with another embodiment of the present invention. The system 600 comprises a real-time media capture module 602, a frame and stream element information extractor 604, a media encoder 606, a system for normal encoded stream playback 608, a real time environmental parameter capture module 610 and an environmental effect encoder 612. In various embodiments of the present invention, the real-time media capture module 602 may be a video camera that captures real time video. In another embodiment of the present invention, the real-time media capture module 502 may be a camera that captures still images. In various embodiments of the present invention, the media stream captured by the media capture module 602 includes, but is not limited to, an image stream, an audio stream, a speech stream, a video stream and an audio-video stream The captured media is then provided to the media encoder 606. The media encoder is a standard encoder that encodes the captured media. In an exemplary embodiment of the present invention, the media encoder 606 takes analog media as input, digitizes and compresses the media. Further, the compressed media may be encrypted using standard algorithms. Output from the media encoder is then provided to the system for normal encoded stream playback 608. The normal encoded stream playback 608 is configured to provide a media output.

The real time environmental parameter capture module 610 is configured to register and record environmental parameters in conjunction with capture of real-time media. Examples of environmental parameters that may be captured include sensory effects such as air temperature, wind velocity, acoustic effects, tactile effects, aromatic effects, color schemes etc. The frame information extractor 604 is configured to extract the encoded media stream along with information about the presence and location of environmental effects in real-time video. In an exemplary embodiment of the present invention, output of the frame information extractor 604 in conjunction with output of the real-time environmental parameter capture 610 is used by the environmental effect encoder 612 to encode environmental parameters. The encoded environmental parameters are then synchronized with the encoded media stream that includes information about presence and location of environmental effects. The synchronized information is then provided to the system for normal encoded stream playback 608. In an embodiment of the present invention, the system for normal encoded stream playback 608 is configured to extract environmental parameters from the synchronized information and then to actuate one or more output devices to simulate the environmental effects in order to provide an immersive surround environment for enhanced content experience.

Figure 7:
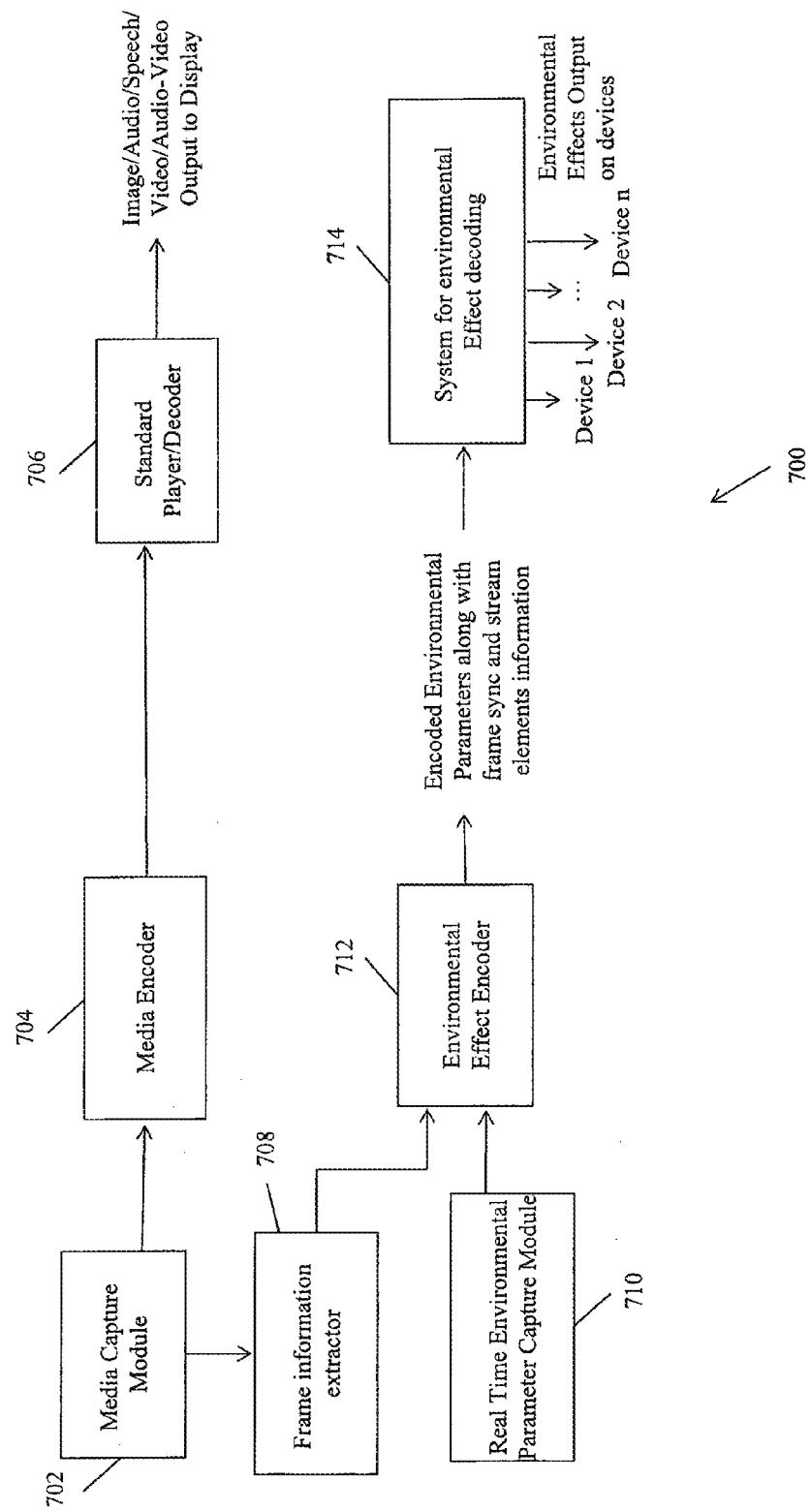
FIG. 7 illustrates a system for providing an immersive surround environment for enhanced content experience of media captured in real-time, wherein separate modules are used for decoding media stream and environmental effects.

FIG. 7 illustrates a system 700 for providing an immersive surround environment for enhanced content experience of media captured in real-time, wherein separate modules are used for decoding media stream and environmental effects. In an embodiment of the present invention, the system 700 comprises modules functioning in a manner similar to modules of the system 600. The system 700 comprises a real-time media capture module 702, an media encoder 704, a frame information extractor 708, a real time environmental parameter capture module 710 and an environmental effect encoder 712. The aforementioned modules function in order to generate an encoded video stream and encoded environmental parameters along with frame synchronization and stream elements information.

In an exemplary embodiment of the present invention, the standard player/decoder 706 takes as input the encoded stream and provides a media output for playback. The system for environmental effect decoding 714 is configured to decode the encoded environmental parameters in frame synchronization and stream elements information and provide the environmental effects output to one or more output devices for simulating environmental effects.

Figure 8:
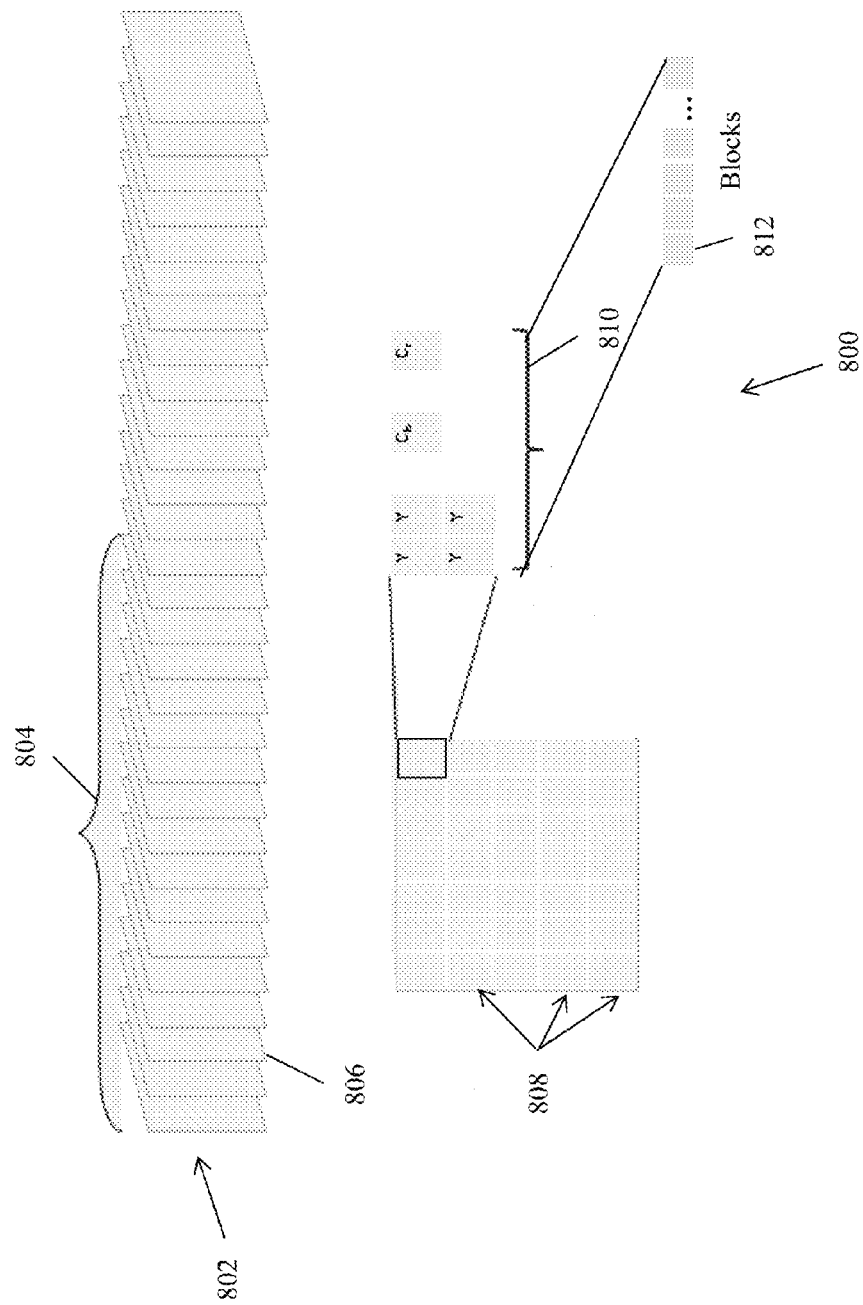
FIG. 8 illustrates embedding environmental parameters at different levels within a video stream.

FIG. 8 illustrates embedding environmental parameters at different levels within a stream. In various embodiments of the present invention, environmental parameters can be embedded at six levels within a video stream with respect to granularity of the stream. The level depiction is generic in nature and covers all video standard structures, however, this varies for video standard to standard. At level 1, environmental parameters can be added globally in the stream 802. Global environment information may be added in a scenario where the environmental conditions related to scenes of a video capture remain constant for the entire stream 802. For example, in case, a video stream is video data related to a single scene shoot in a particular cold place, such as Antarctica, the environmental conditions are constant for the entire video stream.

At level 2, environmental parameters can be added for 'Group of Pictures' 804 for the video stream. A 'Group of Pictures' is associated with a particular scene in a video stream. In an example, since environmental conditions for a particular scene remain same, common environmental parameters can be embedded for the 'Group of Pictures' which override global information. For example, night scene followed by a morning scene. Further, at level 3, environmental parameters can be embedded for a frame which overrides both global and 'Group of Pictures' level information. At level 4, each frame 808 is divided into a region of interest or non-region of interest. Each region thus specified is considered as a slice and environmental parameters for each slice may be different depending upon situation. In an exemplary embodiment, various inanimate objects located at different slices within a frame may require different levels of illumination depending upon the type of object. In an example, the type of illumination required for a metal ball may be different than that required for a chalk. In an embodiment of the present invention, environmental information specific to a slice overrides information at global level, 'Group of Pictures' level, and at frame level.

At level 5, each frame may be divided into macroblocks. Each macroblock 810 is a region of 16×16 pixels for a luminance and 8×8 for chrominance channels. Environmental information which is embedded specific to a macroblock overrides information embedded at levels 1-4.

Finally, at level 6, each macroblock comprises one or more blocks 812. Each block 812 comprises one or more pixels. In an exemplary embodiment of the present invention, environmental information is embedded specific to a pixel in order to introduce increased level of granularity in controlling of environmental information in a frame. The environmental information embedded specific to a pixel overrides information embedded at all levels.

Figure 9:
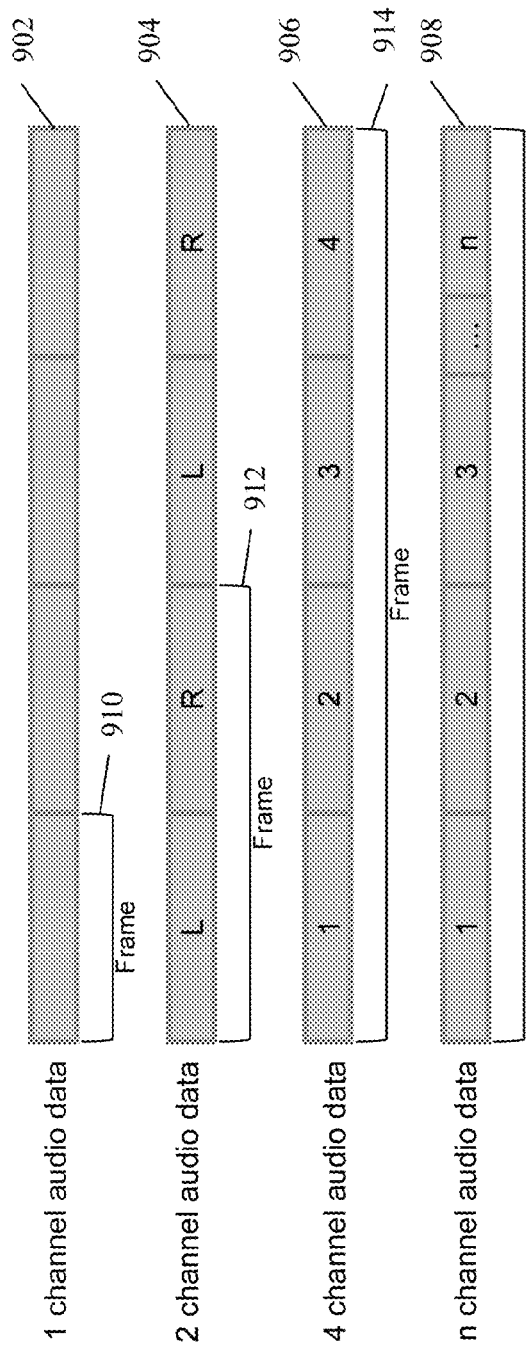
FIG. 9 illustrates audio file structure of an audio stream provided as input to media decoder, in accordance with an embodiment of the present invention.

FIG. 9 illustrates audio file structure of an audio stream provided as input to media decoder, in accordance with an embodiment of the present invention. As shown in the figure, audio streams 902, 904, 906 and 908 comprise 1-channel, 2-channel, 4-channel and n-channel audio data respectively. The method and system of the present invention is configured to process the audio streams 902, 904, 906 and 908. In various embodiments, the system and method of the present invention may receive the audio streams 902, 904, 906 and 908 that are encoded using various audio compression standards having different encoding mechanism. An audio frame is a set of audio samples that are coincident in time. The sample frame 910 for a 1-channel audio data is a single sample. However, the sample frame 912 for a 2-channel audio data consists of a left-right sample pair having left channel samples interleaved alternately with right channel samples.

The audio stream 906 is a 4-channel audio stream with the frame 914 having two left-right sample pairs or other arrangements.

Figure 10:
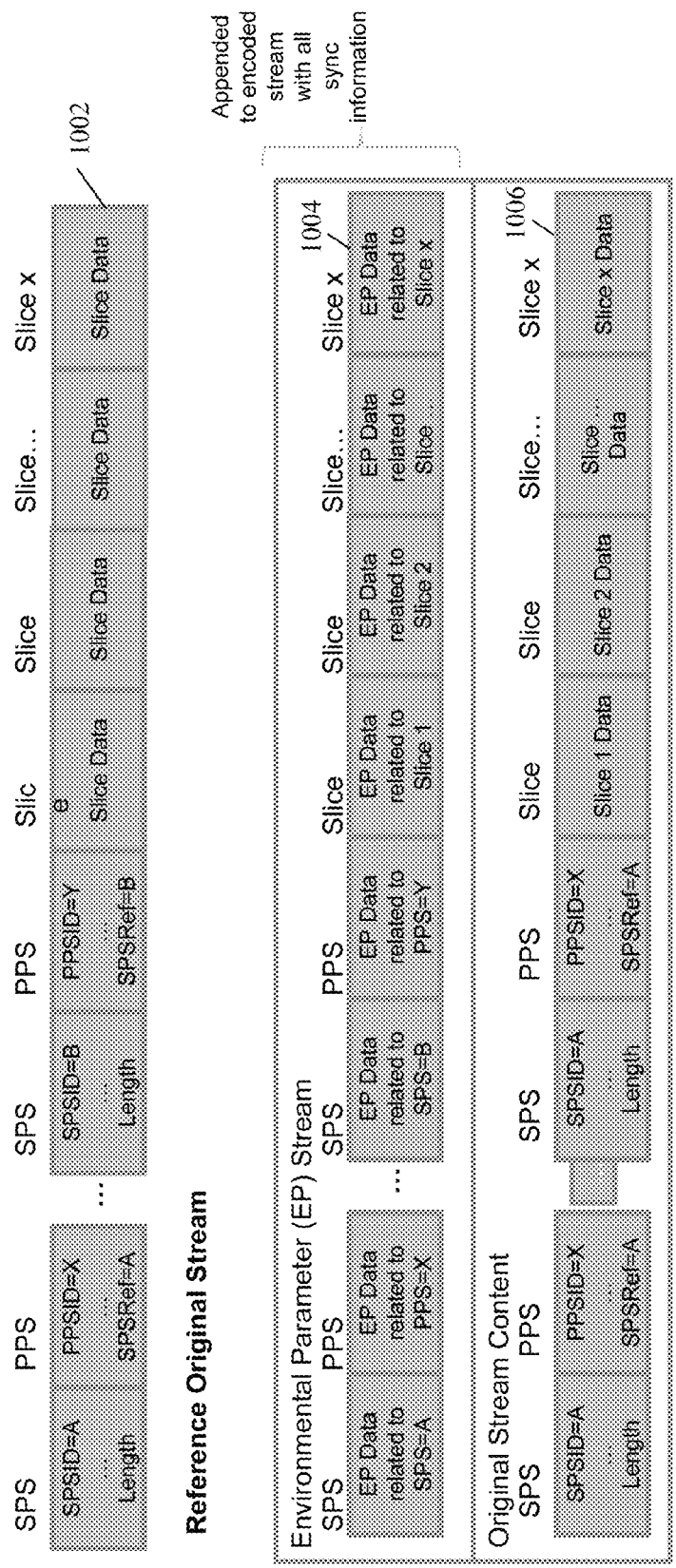
FIG. 10 illustrates embedding a media stream with environmental parameters, in accordance with an embodiment of the present invention.

FIG. 10 illustrates embedding a media stream with environmental parameters, in accordance with an embodiment of the present invention. The encoded stream 1002 is compressed using the H.264 video compression standard. The environmental parameter stream 1004 takes the structure of the encoded stream 1002 such that environmental parameter information can be embedded in a synchronized manner. The environmental parameter stream 1004 uses the same data structure i.e. header is retained and content part of the encoded stream 1002 is ignored. As shown in the figure, the encoded stream 1002 comprises Sequence Parameter Set (SPS), Picture Parameter Set (PPS), slice and other low level identifiers within the slice. In various embodiments of the present invention, the environmental parameter stream 1004 retains the SPS, PPS and slice header information for synchronization and removes the data part. Further, the environmental parameters to be linked or mapped to a specific identifier are embedded to the encoded stream content 1006 i.e. to the SPS, PPS and slice part in order to obtain encoded stream embedded with environmental parameters.

Figure 11:
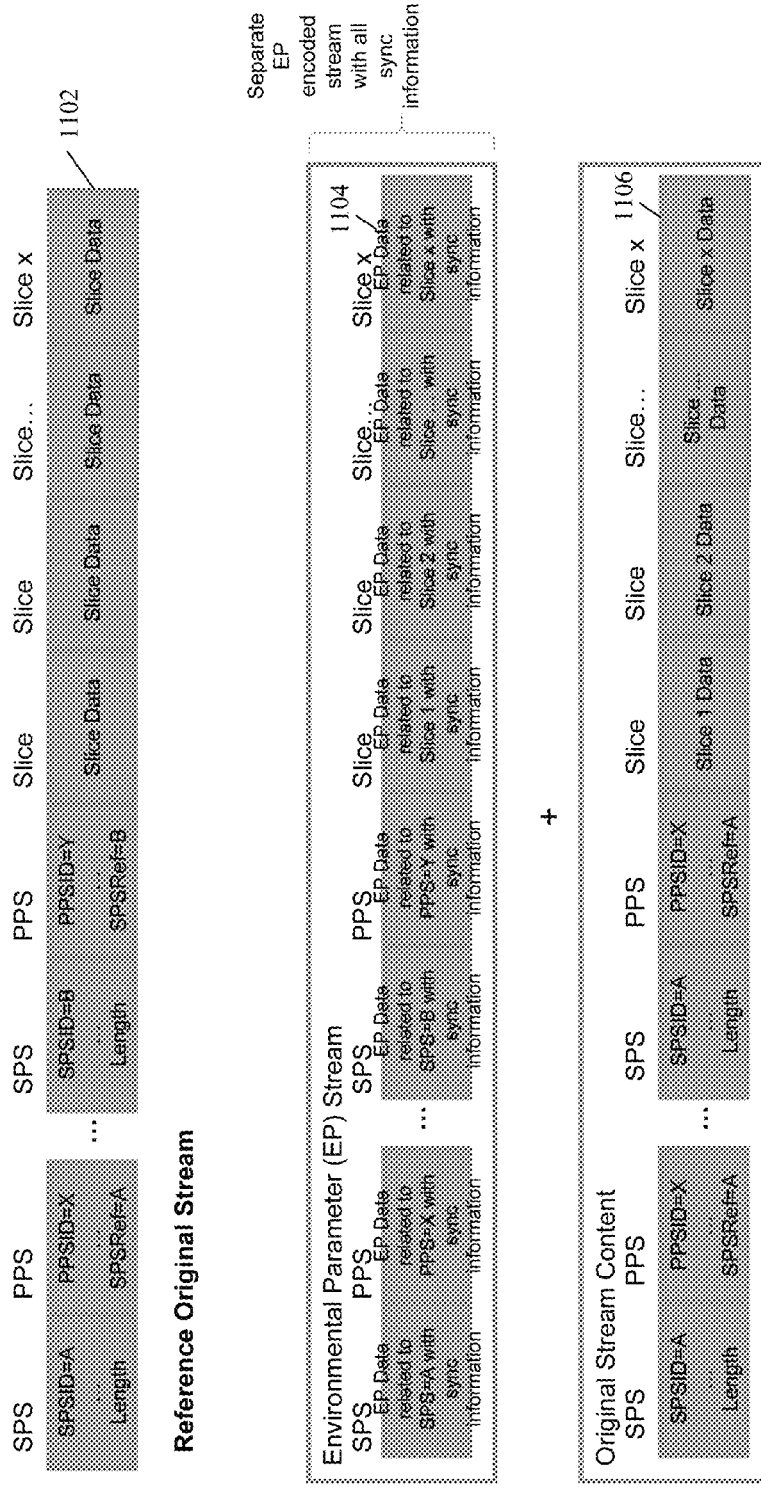
FIG. 11 illustrates encoding of environmental parameters separately outside of media stream, in accordance with an embodiment of the present invention.

FIG. 11 illustrates encoding a media stream with environmental parameters, in accordance with an embodiment of the present invention. In various embodiments of the present invention, the environmental parameter stream to be encoded separately takes the structure of the encoded stream 1102 with which it has to be synced. However, the environmental parameter structure is generic in nature. The environmental parameter stream 1104 comprises placeholders for image/audio/speech/video/audio-video content similar to audio-video file format container. Examples of placeholders include placeholders for image streams such as JPEG, PNG etc., placeholders for audio/speech streams such as MP3, placeholders for audio streams and audio-video file formats. However, the environmental parameter encoder uses data structure minus the data of that standard encoded stream and rest of the references for other media standards are left empty. As shown in the figure, the encoded stream 1102 comprises Sequence Parameter Set (SPS), Picture Parameter Set (PPS), slice and other low level identifiers within the slice. In various embodiments of the present invention, the environmental parameter stream 1104 retains the SPS, PPS and slice header information for synchronization and removes the data part. Further, the environmental parameters to be linked or mapped to a specific identifier are inserted in the encoded stream content 1106 i.e. to the SPS, PPS and slice part in order to obtain stream with encoded environmental parameters.

Figure 12:
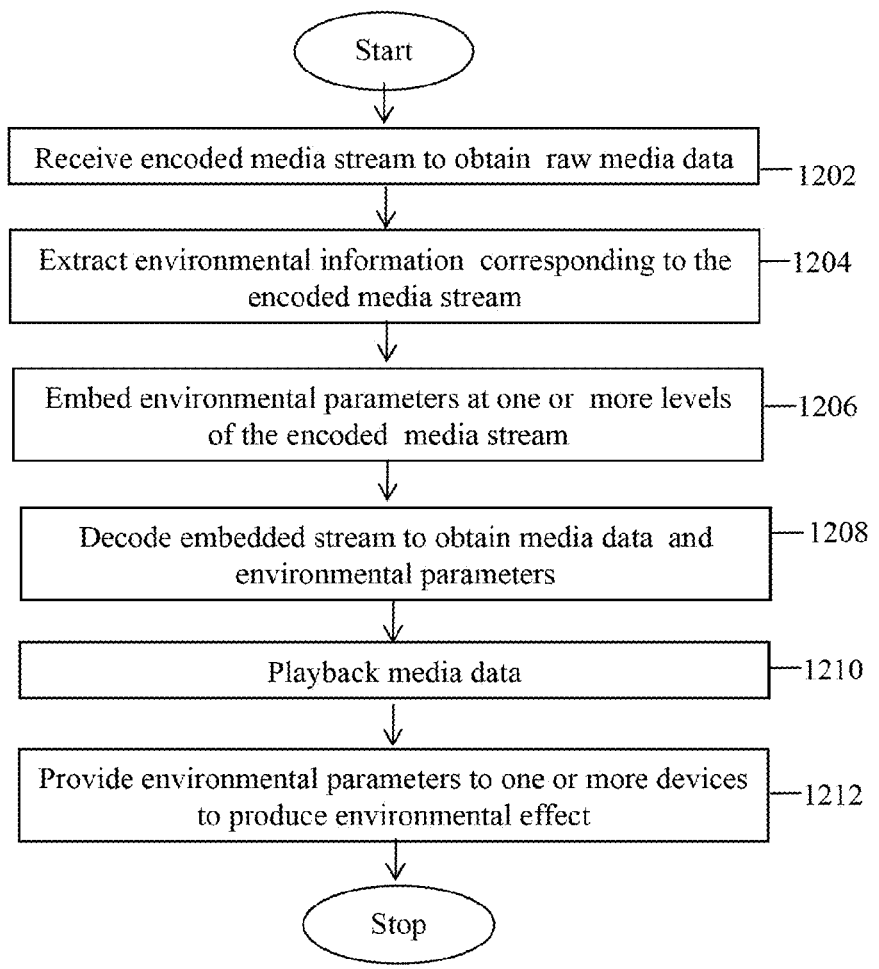
FIG. 12 is a flowchart illustrating a method for providing an immersive surround environment for enhanced content experience, in accordance with an embodiment of the present invention.

FIG. 12 is a flowchart illustrating a method for providing an immersive surround environment for enhanced content experience, in accordance with an embodiment of the present invention.

At step 1202, encoded media stream is received to obtain raw media data. In an embodiment of the present invention, the encoded media stream includes, but is not limited to, a still image stream, an audio stream, a speech stream, a video stream and an audio video stream. The raw media data includes, but is not limited to, still image data, audio data, speech data, video data and audio video data.

In an embodiment of the present invention, the encoded media stream may be compressed in accordance with standard video specifications such as Moving Picture Experts Group-2 (MPEG-2), Moving Picture Experts Group-4 (MPEG-4), Motion Joint Photographic Experts Group (JPEG), Motion JPEG-2000, Audio Video Standard (AVS), Video Codec standard 1 (VC-1), Dirac, H.264 etc., or audio video file format such as Audio Video Interleave (AVI), 3GP, Windows Media Video (WMV), Digital Video Express (DivX), Moving Picture Experts Group-4 (MPEG-4), Advanced Video Codec High Definition (AVCHD), Windows Media Audio (WMA), Waveform Audio File Format (WAV), MPEG-1 Audio Layer 3 (MP3) etc. In another embodiment of the present invention, the encoded media stream may be a raw uncompressed stream. In an embodiment of the present invention, the encoded media stream may comprise various pictures that are captured by a camera. The encoded media stream is decompressed or decoded to obtain the raw media data.

At step 1204, environmental information corresponding to the encoded media stream is extracted. In an embodiment of the present invention, the encoded media stream may comprise several environmental information such as temperature, ambient light, humidity, wind velocity, thunder, ice, snow, fog, wind etc. associated with the pictures captured. The environmental parameters are extracted from the encoded media stream employing several factors such as color layout, structure, shape, region, texture, location, face, motion etc. of image/video stream and/or pitch, harmony, tempo, rhythm, loudness, lyrics analyzer for audio/speech stream and all of the above for audio video stream. In another embodiment of the present invention, the environmental information may be manually extracted. In yet another embodiment of the present invention, the environmental information may be artificially simulated.

At step 1206, environmental parameters are embedded at one or more levels of the encoded media stream. In various embodiments of the present invention, the environmental parameters corresponding to the extracted environmental information are synchronized with the encoded media stream. Synchronization of the environmental parameters with encoded media stream includes processing of the parameters such as temperature, ambient light, humidity etc. in order to align the parameters with the encoded media stream. In an embodiment of the present invention, the environmental parameters are embedded at different granular levels of the color layout, structure, shape, region, texture, location, face, motion etc. of image/video stream and/or pitch, harmony, tempo, rhythm, loudness, lyrics analyzer for audio/speech stream and all of the above for audio video stream. In an embodiment of the present invention, the environmental parameters may be embedded at six different levels of the encoded media stream. At level 1, environmental parameters may be added globally in the encoded media stream if the encoded media stream is related to a single scene shot and the environmental conditions are constant for the entire encoded media stream. At level 2, environmental parameters may be added for 'Group of Pictures' which is associated with a particular scene in the encoded media stream. Since environmental conditions for a particular scene remain same, common environmental parameters may be embedded for the 'Group of Pictures' which override global information.

Further, at level 3, environmental parameters may be embedded for a frame which overrides both global and 'Group of Pictures' level information. At level 4, each frame is divided into a region of interest or non-region of interest. Each region thus specified is considered as a slice and environmental parameters for each slice may be different depending upon situation. Finally, at level 5, each frame may be divided into macroblocks. Each macroblock is a region of 16×16 pixels for luminance and 8×8 pixels for chrominance channels. Environmental parameters which are embedded specific to a macroblock overrides information embedded at all levels. Further, at level 6, each macroblock comprises one or more blocks which comprise one or more pixels. In an exemplary embodiment of the present invention, environmental parameters are embedded specific to a pixel in order to introduce increased level of granularity in controlling of environmental information in a frame. The environmental parameters embedded specific to a pixel overrides information embedded at all levels.

In another embodiment of the present invention, environmental parameters may be embedded in an audio stream irrespective of the structure of the audio stream. The audio stream may include different number of channels in the audio stream. In an exemplary embodiment of the present invention, the audio stream may be one channel audio stream i.e. a mono stream where each frame comprises a single audio sample. In another exemplary embodiment of the present invention, the audio stream may be two channel audio stream i.e. a stereo stream where each frame comprises a left-right audio sample pair. The audio samples may be interleaved where the left-channel samples alternate with right-channel samples. In yet another exemplary embodiment of the present invention, the audio stream may be a four channel audio stream where each frame may have two left-right audio sample pairs. The audio samples may be interleaved where the left-channel samples alternate with right-channel samples. In an embodiment of the present invention, different audio compression standards may have different encoding mechanism, however, the decoded raw audio content follows the above mentioned structure.

At step 1208, the embedded stream is decoded to obtain media data and environmental parameters. In an embodiment of the present invention, the embedded stream including the environmental parameters is decoded and/or decompressed to output media data along with the environmental parameters. In an embodiment of the present invention, the media data is split from the environmental parameters.

At step 1210, the media data playback occurs. At step 1210, environmental parameters are provided to one or more devices to produce environmental effect. In an embodiment of the present invention, the environmental parameters are provided to one or more output devices that control environmental conditions. The environmental effects output produced from the environmental parameters are presented to the one or more devices to produce an effect corresponding to the environmental conditions in the encoded stream. For example, if the environmental effect corresponds to a chilly night, the temperature of the air conditioning system may be controlled to produce a chilly effect.

Figure 13:
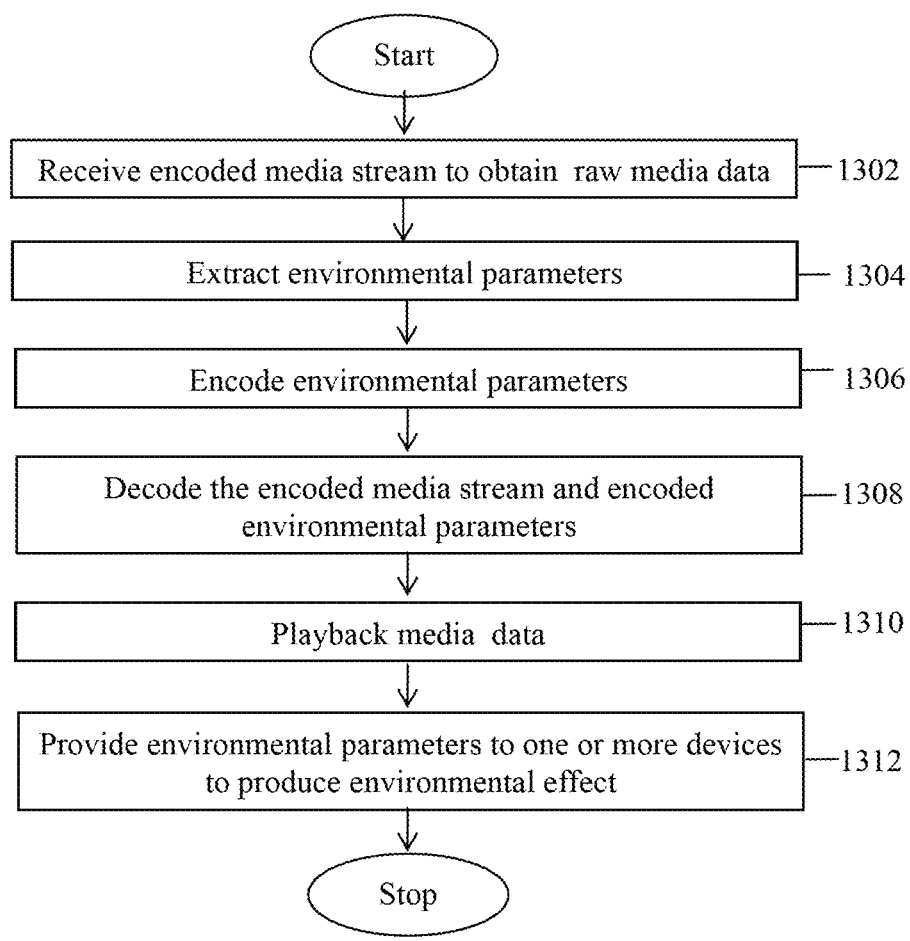
FIG. 13 is a flowchart illustrating a method for providing an immersive surround environment for enhanced content experience, in accordance with another embodiment of the present invention.

FIG. 13 is a flowchart illustrating a method for providing an immersive surround environment for enhanced content experience, in accordance with another embodiment of the present invention.

At step 1302, encoded media stream is received to obtain raw media data. In various embodiments of the present invention, the encoded media stream may be a video, audio, speech, and/or still image stream which is compressed in accordance with standard video specifications, such as, Moving Picture Experts Group (MPEG-2), Moving Picture Experts Group (MPEG-4), Audio Video Standard (AVS), Video Codec standard 1 (VC-1), Dirac, H.264 etc., or audio video file format such as Audio Video Interleave (AVI), 3GP, Windows Media Video (WMV), Digital Video Express (DivX), Moving Picture Experts Group (MPEG-4), Advanced Video Codec High Definition (AVCHD), Windows Media Audio (WMA), Advanced Audio Coding (AAC), Audio Codec 3 (AC3), Waveform Audio File Format (WAV), JPEG2000, Joint Photographic Experts Group (JPEG), Portable Network Graphics (PNG) etc. In another embodiment of the present invention, the encoded media stream may be a raw uncompressed stream. In an embodiment of the present invention, the media stream may comprise various pictures/sound that are captured by a camera. The media stream is decompressed or decoded to obtain the raw media data.

At step 1304, environmental parameters corresponding to the encoded media stream are extracted. In an embodiment of the present invention, the encoded media stream may comprise several environmental parameters such as temperature, ambient light, humidity, wind velocity, thunder, ice, snow, fog, wind etc. associated with the pictures captured. The environmental parameters are extracted from the media stream employing several factors such as color layout, structure, shape, region, texture, location, face, motion etc. of image/video stream and/or pitch, harmony, tempo, rhythm, loudness, lyrics analyzer for audio/speech stream and all of the above for audio video stream. In another embodiment of the present invention, the environmental parameters may be manually extracted. In yet another embodiment of the present invention, the environmental parameters may be artificially simulated.

At step 1306, environmental parameters are encoded. In an embodiment of the present invention, the environmental parameters are encoded along with frame synchronization and one or more stream element information. The frame synchronization and stream elements information represents information regarding various environmental parameters corresponding to each frame in the media stream. In an embodiment of the present invention, the environmental parameters may be encoded at six different levels of the encoded media stream. At level 1, environmental parameters may be added globally in the encoded media stream if the encoded media stream is related to a single scene shot and the environmental conditions are constant for the entire encoded media stream. At level 2, environmental parameters may be added for 'Group of Pictures' which is associated with a particular scene in the encoded media stream. Since environmental conditions for a particular scene remain same, common environmental parameters may be embedded for the 'Group of Pictures' which override global information.

Further, at level 3, environmental parameters may be encoded for a frame which overrides both global and 'Group of Pictures' level information. At level 4, each frame is divided into a region of interest or non-region of interest. Each region thus specified is considered as a slice and environmental parameters for each slice may be different depending upon situation. Finally, at level 5, each frame may be divided into macroblocks. Each macroblock is a region of 16×16 pixels for luminance and 8×8 pixels for chrominance channels. Environmental parameters which are encoded specific to a macroblock overrides information encoded at all levels. Further, at level 6, each macroblock comprises one or more blocks which comprises one or more pixels. In an exemplary embodiment of the present invention, environmental parameters are encoded specific to a pixel in order to introduce increased level of granularity in controlling of environmental information in a frame. The environmental parameters encoded specific to a pixel overrides information encoded at all levels.

In another embodiment of the present invention, environmental parameters may be encoded in an audio stream irrespective of the structure of the audio stream. The audio stream may include different number of channels in the audio stream. In an exemplary embodiment of the present invention, the audio stream may be one channel audio stream i.e. a mono stream where each frame comprises a single audio sample. In another exemplary embodiment of the present invention, the audio stream may be two channel audio stream i.e. a stereo stream where each frame comprises a left-right audio sample pair. The audio samples may be interleaved where the left-channel samples alternate with right-channel samples. In yet another exemplary embodiment of the present invention, the audio stream may be a four channel audio stream where each frame may have two left-right audio sample pairs. The audio samples may be interleaved where the left-channel samples alternate with right-channel samples. In an embodiment of the present invention, different audio compression standards may have different encoding mechanism, however, the decoded raw audio content follows the above mentioned structure.

In an embodiment of the present invention, encoding the environmental parameters with the encoded media stream comprises mapping the environmental parameters with one or more specific identifiers of the encoded media stream. For example, an encoded media stream compressed using H.264 standard typically comprises Sequence Parameter Set (SPS), Picture Parameter Set (PPS), slice and other low level identifiers within the slice. The environmental parameters are mapped to the SPS, PPS, slice identifiers for synchronization of the environmental parameters with the encoded media stream. The content in the encoded media stream is removed.

At step 1308, the encoded media stream and the encoded environmental parameters are decoded. In an embodiment of the present invention, the encoded media stream is decoded to output the media data. Further, the encoded environmental parameters along with the frame synchronization and one or more stream element information are decoded to obtain the environmental parameters.

At step 1310, the media data playback occurs. At step 1312, environmental parameters are provided to one or more devices to produce environmental effects. In an embodiment of the present invention, the environmental parameters are provided to one or more output devices that control environmental conditions. The environmental effects output produced from the environmental parameters are presented to the one or more devices to produce an effect corresponding to the environmental conditions in the encoded stream. For example, if the environmental effect corresponds to a vibration effect, a vibration device may be actuated to produce a vibration effect.

Figure 14:
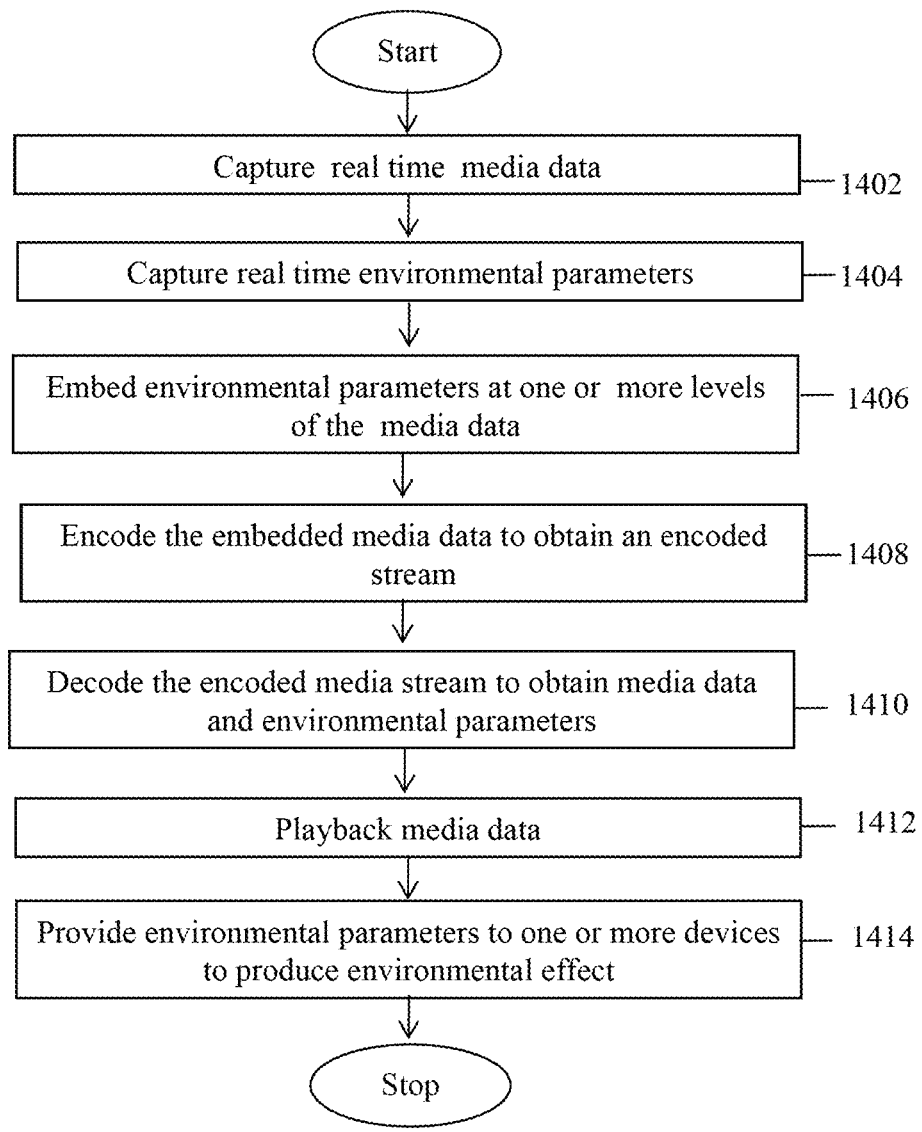
FIG. 14 is a flowchart illustrating a method for providing an immersive surround environment for enhanced content experience, in accordance with yet another embodiment of the present invention.

FIG. 14 is a flowchart illustrating a method for providing an immersive surround environment for enhanced content experience, in accordance with yet another embodiment of the present invention.

At step 1402, media data is captured in real time. In various embodiments of the present invention, media data may be captured in real time by a camera. The media data may include, but is not limited to, still image data, audio data, speech data, video data and audio video data. The media data may correspond to a scene being shot in a particular environmental condition, for example, a cold night or some images that are captured.

At step 1404, environmental parameters are captured in real time. In various embodiments of the present invention, environmental parameters corresponding to environmental conditions associated with the media data may be captured in real time. Examples of environmental parameters may be temperature, wind velocity, humidity, light intensity, illumination details etc.

At step 1406, environmental parameters are embedded at one or more levels of the media data. In various embodiments of the present invention, the environmental parameters are synchronized with the media data. Synchronization of the environmental parameters with media data include processing of the parameters such as temperature, ambient light, humidity etc. in order to align the parameters with the media data and embed them at different granular levels of the media data. In an embodiment of the present invention, the environmental parameters may be embedded at six different levels of the media data. At level 1, environmental parameters may be added globally in the media data if the media data is related to a single scene shoot and the environmental conditions are constant for the entire audio video and/or still image data. At level 2, environmental parameters can be added for 'Group of Pictures' which is associated with a particular scene in the media data. Since environmental conditions for a particular scene remain same, common environmental parameters can be embedded for the 'Group of Pictures' which override global information.

Further, at level 3, environmental parameters may be embedded for a frame which overrides both global and 'Group of Pictures' level information. At level 4, each frame is divided into a region of interest or non-region of interest. Each region thus specified is considered as a slice and environmental parameters for each slice may be different depending upon situation. Finally, at level 5, each frame may be divided into macroblocks. Each macroblock 310 is a region of 16×16 pixels for luminance and 8×8 pixels for chrominance channels. Environmental information which is embedded specific to a macroblock overrides information embedded at all levels. Further, at level 6, each macroblock comprises one or more blocks which comprise one or more pixels. In an exemplary embodiment of the present invention, environmental information is embedded specific to a pixel in order to introduce increased level of granularity in controlling of environmental information in a frame. The environmental information embedded specific to a pixel overrides information embedded at all levels.

In another embodiment of the present invention, environmental parameters may be embedded in an audio data irrespective of the structure of the audio data. The audio data may include different number of channels. In an exemplary embodiment of the present invention, the audio data may be one channel audio data i.e. where each frame comprises a single audio sample. In another exemplary embodiment of the present invention, the audio data may be two channel audio data where each frame comprises a left-right audio sample pair. The audio samples may be interleaved where the left-channel samples alternate with right-channel samples. In yet another exemplary embodiment of the present invention, the audio data may be a four channel audio data where each frame may have two left-right audio sample pairs. The audio samples may be interleaved where the left-channel samples alternate with right-channel samples. In an embodiment of the present invention, different audio compression standards may have different encoding mechanism, however, the decoded raw audio content follows the above mentioned structure.

At step 1408, the embedded media data is encoded to output an encoded media stream. In an embodiment of the present invention, one or more environmental parameters may be selectively incorporated in the media data based on requirement. Selective incorporation of environmental parameters may include analyzing which environmental parameters may be considered and which of the environmental parameters may be discarded.

At step 1410, the encoded media data is decoded to obtain media data and environmental parameters. In an embodiment of the present invention, the embedded stream including the environmental parameters is decoded or decompressed to output the media data along with the one or more environmental parameters. In an embodiment of the present invention, the media data is split from the environmental parameters.

At step 1412, the media data is rendered. At step 1114, environmental parameters are provided to one or more devices to produce environmental effect. In an embodiment of the present invention, the environmental parameters are provided to one or more output devices that control environmental conditions. The environmental effects output produced from the environmental parameters are provided to the one or more devices to produce an effect corresponding to the environmental conditions in the media data. For example, if the environmental effect corresponds to a chilly night, the temperature of an air conditioning system in may be controlled to produce a chilly effect.

Figure 15:
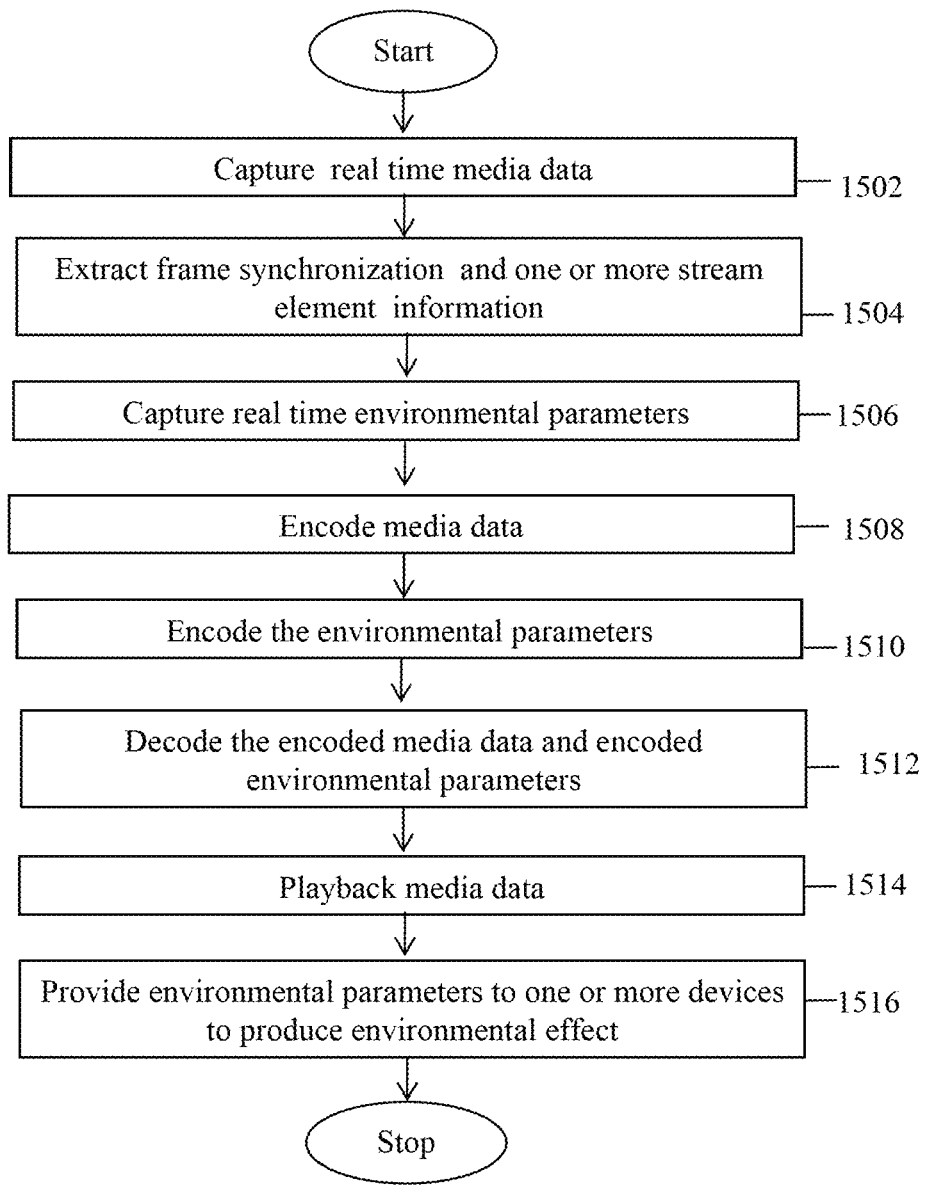
FIG. 15 is a flowchart illustrating a method for providing an immersive surround environment for enhanced content experience, in accordance with yet another embodiment of the present invention.

FIG. 15 is a flowchart illustrating a method for providing an immersive surround environment for enhanced content experience, in accordance with yet another embodiment of the present invention.

At step 1502, media data is captured in real time. In various embodiments of the present invention, media data may be captured in real time by a camera. The media data may include, but is not limited to, still image data, audio data, speech data, video data and audio video data The media data may correspond to a scene being shot in a particular environmental condition, for example, a cold night.

At step 1504, frame synchronization and one or more stream element information is extracted from the media data. In an embodiment of the present invention, the frame synchronization and stream elements information represents information regarding various environmental parameters corresponding to each frame in the media data.

At step 1506, environmental parameters are captured in real time. In various embodiments of the present invention, environmental parameters corresponding to environmental conditions associated with the media data may be captured in real time. Examples of environmental parameters may be temperature, wind velocity, humidity, light intensity, illumination details etc.

At step 1508, the media data is encoded. At step 1510, the environmental parameters are encoded. In an embodiment of the present invention, the environmental parameters are encoded along with frame synchronization and one or more stream element information. In an embodiment of the present invention, the environmental parameters may be encoded at six different levels of the audio video and/or still image stream. At level 1, environmental parameters may be added globally in the encoded media data if the encoded media data is related to a single scene shot and the environmental conditions are constant for the entire encoded media data. At level 2, environmental parameters may be added for 'Group of Pictures' which is associated with a particular scene in the encoded media data. Since environmental conditions for a particular scene remain same, common environmental parameters may be embedded for the 'Group of Pictures' which override global information.

Further, at level 3, environmental parameters may be encoded for a frame which overrides both global and 'Group of Pictures' level information. At level 4, each frame is divided into a region of interest or non-region of interest. Each region thus specified is considered as a slice and environmental parameters for each slice may be different depending upon situation. Finally, at level 5, each frame may be divided into macroblocks. Each macroblock is a region of 16×16 pixels for luminance and 8×8 pixels for chrominance channels. Environmental parameters which are encoded specific to a macroblock overrides information encoded at all levels. Further, at level 6, each macroblock comprises one or more blocks which comprises one or more pixels. In an exemplary embodiment of the present invention, environmental parameters are encoded specific to a pixel in order to introduce increased level of granularity in controlling of environmental information in a frame. The environmental parameters encoded specific to a pixel overrides information encoded at all levels.

In another embodiment of the present invention, environmental parameters may be encoded in an audio data irrespective of the structure of the audio data. The audio data may include different number of channels in the audio data. In an exemplary embodiment of the present invention, the audio data may be one channel audio data where each frame comprises a single audio sample. In another exemplary embodiment of the present invention, the audio data may be two channel audio data where each frame comprises a left-right audio sample pair. The audio samples may be interleaved where the left-channel samples alternate with right-channel samples. In yet another exemplary embodiment of the present invention, the audio data may be four channel audio data where each frame may have two left-right audio sample pairs. The audio samples may be interleaved where the left-channel samples alternate with right-channel samples. In an embodiment of the present invention, different audio compression standards may have different encoding mechanism, however, the decoded raw audio content follows the above mentioned structure.

At step 1512, the encoded media data and the encoded environmental parameters are decoded. In an embodiment of the present invention, the encoded media data is decoded to output the media data. Further, the encoded environmental parameters are decoded to obtain environmental parameters.

At step 1514, the media data is rendered. At step 1216, environmental parameters are provided to one or more devices to produce environmental effects. In an embodiment of the present invention, the environmental parameters are provided to one or more output devices that control environmental conditions. The environmental effects output produced from the environmental parameters are provided to the one or more devices to produce an effect corresponding to the environmental conditions in the media data. For example, if the environmental effect corresponds to a certain aroma, the aroma producers may be actuated to produce an aroma effect.

The present invention may be implemented in numerous ways including as a apparatus, method, or a computer program product such as a computer readable storage medium or a computer network wherein programming instructions are communicated from a remote location.

While the exemplary embodiments of the present invention are described and illustrated herein, it will be appreciated that they are merely illustrative. It will be understood by those skilled in the art that various modifications in form and detail may be made therein without departing from or offending the spirit and scope of the invention as defined by the appended claims.

What is claimed is:

1. A system for providing an immersive surround environment for enhanced content experience, the system comprising:
    a decoder configured to receive an encoded media stream, the encoded media stream comprising different types of media data, environmental parameters associated with the different types of media data, frame synchronization information and stream elements information, and further configured to decompress and decode the media stream;
    a content analyzer configured to analyze the decoded media stream and further configured to extract the environmental parameters corresponding to the different types of media data in the decoded media stream;
    a stream and environmental parameter synchronization module configured to identify one or more additional environmental parameters based on the extracted environmental parameters and further configured to simulate the identified additional environmental parameters for the different types of media data;
    an environmental effect encoder configured to encode the extracted environmental parameters and the simulated environmental parameters corresponding to the different types of media data and further configured to synchronize the environmental parameters with the frame synchronization information and the stream elements information corresponding to the encoded media stream to generate encoded environmental parameters; and
    an encoded stream playback system configured to decode the encoded media stream and the encoded environmental parameters, wherein the encoded stream playback system is further configured to provide media output to an audio/visual equipment for playback and to provide the decoded environmental parameters to one or more output devices for simulating environmental effects in conjunction with the media output.

2. The system of claim 1, wherein the encoded stream playback system comprises:
    a standard player/decoder configured to decode the encoded stream and provide the media output to the audio/visual equipment; and
    an environmental effect playback system configured to provide the decoded environmental parameters to the one or more output devices for simulating the environmental effects.

3. The system of claim 1, wherein the encoded media stream is encoded in accordance with standard file formats, the standard file formats comprise: MPEG-2, MPEG-4, AVS, VC-1, Dirac, H.264, AAC, AC3, G.711, G.723, MP3, JPEG, JPEG 2000, BMP, GIF, TIFF, WAV, MPEG, AC3, AAC, WMA, AVI, 3GP, WMV, DivX, AVCHD and PNG.

4. The system of claim 1, wherein the environmental parameters are at least one of temperature, ambient light, humidity and wind velocity.

5. The system of claim 4, wherein the environmental parameters are extracted from color layout, structure, shape, region, texture, location, face, motion of image/video stream and/or pitch, harmony, tempo, rhythm, loudness, lyrics analyzer for audio speech stream and all for audio-video stream.

6. The system of claim 1, wherein the different types of media data comprise an image stream, an audio stream, a speech stream, a video stream and an audio-video stream.

7. The system of claim 1, wherein the encoded media stream includes media stream captured at real-time.

8. A method for providing an immersive surround environment for enhanced content experience, the method comprising:
    receiving an encoded media stream, the encoded media stream comprising different types of media data, environmental parameters associated with the different types of media data, frame synchronization information, stream elements information, and processing the encoded media stream to obtain the decoded media data;
    extracting the one or more environmental parameters corresponding to the different types of media data from the decoded media data;
    identifying one or more additional environmental parameters based on the extracted environmental parameters;
    simulating the identified additional environmental parameters for the different types of media data;
    encoding the extracted one or more environmental parameters and the simulated at least one of the environmental parameters;
    synchronizing the encoded one or more environmental parameters with the frame synchronization information and the stream elements information corresponding to the encoded media stream to output an encoded environmental parameter stream;
    decoding the encoded media stream to obtain media output;

decoding the encoded environmental parameter stream to obtain one or more environmental parameters; and providing the one or more environmental parameters to one or more devices that control environmental conditions to simulate environmental effects in conjunction with the media output.

9. The method of claim 8, wherein the step of encoding the one or more environmental parameters comprises encoding the one or more environmental parameters at various levels within the encoded stream.

10. The method of claim 9, wherein the various levels comprise at least one of: stream, group of pictures, frame, slice, macroblock and block.

11. The method of claim 8, wherein the step of encoding the one or more environmental parameters to output the encoded environmental parameter stream comprises the steps of:

replicating encoded media stream structure by retaining header information of the encoded media stream; and mapping the one or more environmental parameters to one or more specific identifiers of the encoded media stream.

12. The method of claim 8, further comprising:

receiving an environmental parameter stream comprising the one or more environmental parameters;

replicating an encoded media stream by retaining header information of the encoded media stream;

incorporating placeholders corresponding to at least one of image streams, audio/speech streams, audio streams and audio-video file formats;

mapping the one or more environmental parameters to one or more specific identifiers of the replicated encoded media stream.

13. The method of claim 8, wherein the encoded media stream includes media stream captured at real-time.

* * * * *